United States Patent [19]

Hellums

[11] Patent Number: 5,362,988
[45] Date of Patent: Nov. 8, 1994

[54] LOCAL MID-RAIL GENERATOR CIRCUIT
[75] Inventor: James R. Hellums, Dallas, Tex.
[73] Assignee: Texas Instruments Incorporated, Dallas, Tex.
[21] Appl. No.: 161,212
[22] Filed: Dec. 2, 1993

Related U.S. Application Data

[63] Continuation of Ser. No. 877,333, May 1, 1992, abandoned.
[51] Int. Cl.⁵ .............................................. H03K 3/01
[52] U.S. Cl. .................................. 327/543; 327/530; 327/306
[58] Field of Search ............ 307/443, 451, 264, 296.1, 307/296.8

[56] References Cited

U.S. PATENT DOCUMENTS 4,442,398  4/1984  Bertails et al. ................... 307/296.8
4,634,894  1/1987  Shu et al. ........................ 307/296.8

Primary Examiner—Margaret R. Wambach
Attorney, Agent, or Firm—W. James Brady, III; Richard L. Donaldson

[57] ABSTRACT

A voltage generation circuit (10) is provided including a first plurality of transistors (12, 14, 16, 18) having source/drain paths coupled in series to establish a first current path between a first voltage rail and a second voltage rail, the first transistors (12, 14, 16, 18) matched to provide a preselected intermediate voltage at a node (A) along the first current path. A second plurality of transistors (20, 22, 24, 26) are provided having source/drain paths coupled in series to establish a second current path between the voltage rails, and coupled to the first transistors (12, 14, 16, 18) such that current flow in the second current path selected ones of mirrors current flow in the first current path, the second plurality of transistors (20, 22, 24, 26) matched to provide a voltage substantially equal to the intermediate voltage at a node (B) along the second current path. A pair of output transistors (28, 30) are provided having source/drain paths coupled in series to establish a third current path between the voltage rails. A first one of the output transistors (28) is coupled as a current mirror with a first one of the second plurality of transistors (22), and a second one of the output transistors (30) is coupled as a current mirror with a second one of the second plurality of transistors (24). The first and second output transistors (28, 30) have channel width to length ratios n times the channel width to length ratios of the first and second ones (22, 24), respectively, of the second plurality of transistors to provide a voltage $V_{AGND}$ substantially equal to the intermediate voltage coupling the source/drain paths of the output transistors (28, 30).

19 Claims, 1 Drawing Sheet

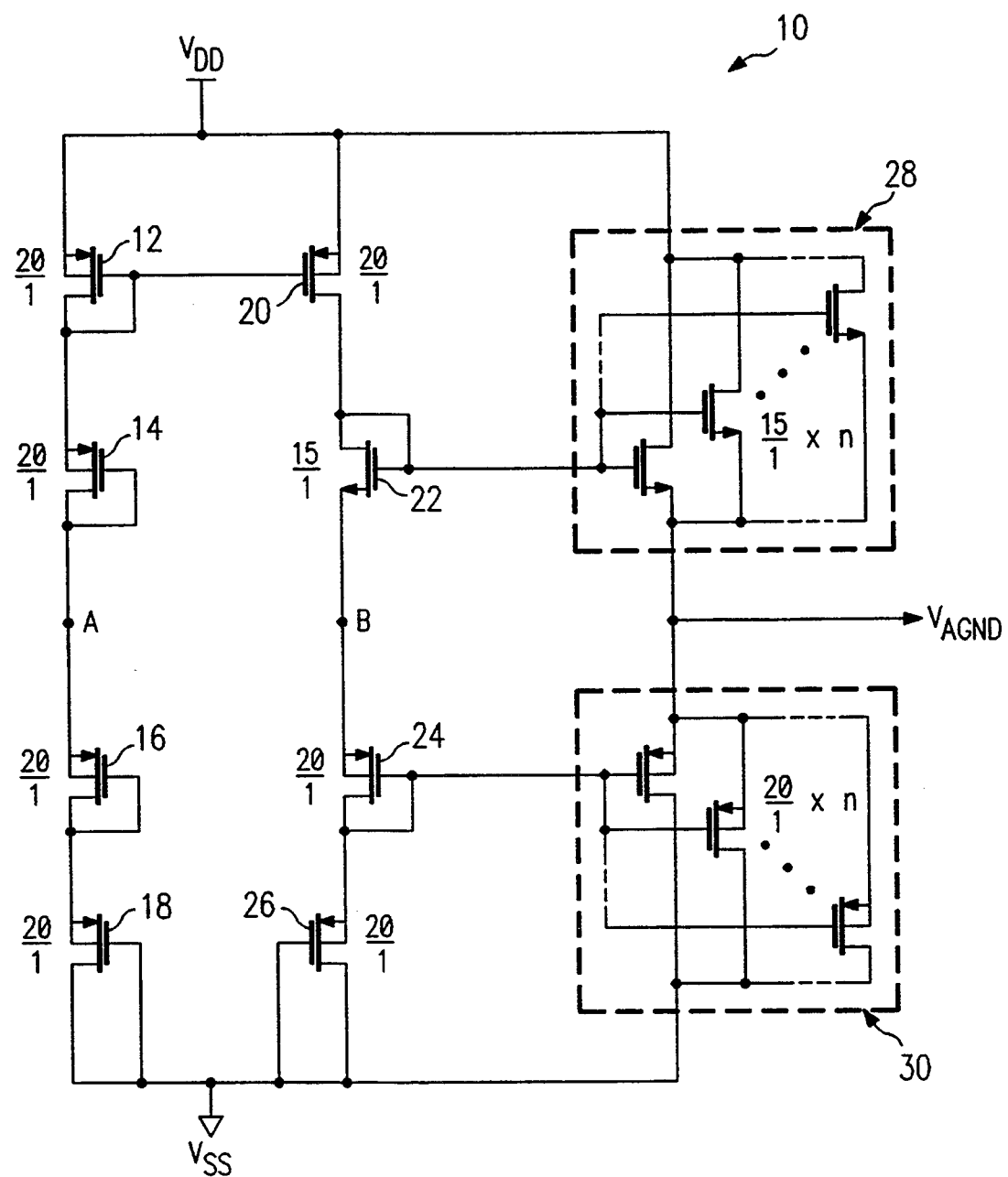

LOCAL MID-RAIL GENERATOR CIRCUIT

This application is a continuation of application Ser. No. 07/877,333, filed May 1, 1992, now abandoned.

TECHNICAL FIELD OF THE INVENTION

The present invention relates in general to electronic circuits and in particular to voltage generation circuits and methods.

BACKGROUND OF THE INVENTION

Integrated circuit systems which include analog devices and which employ only a single voltage power supply require the generation on-chip of a mid-supply voltage for use as an analog ground (AGND) reference. One simple method to provide the mid-supply voltage is through a voltage divider consisting of two equally valued resistors connected in series between the positive voltage supply (i.e., the positive rail) and ground. One way of fabricating these resistors is to use the nsemiconductor in which p-MOS devices are normally fabricated. While the n- resistors have the advantage of being small, they suffer from the substantial disadvantage of having a high voltage coefficient. This voltage coefficient has two primary components, first, the end-to-end voltage coefficient due to the voltage drop across the resistor when current flows, and second, a backgate or body effect component due to reverse biasing from the channel of the resistor and the substrate. The component of the voltage coefficient caused by the backgate or body effect is the more serious problem, since it causes the two resistors to have different resistance values, even though the resistors have equal physical size, due to the pinching effect of the depletion region between the channel and the substrate.

A second option is to use polysilicon resistors. The use of polysilicon resistors eliminates the problem of the backgate or body effect component of the overall voltage coefficient; however, the end-to-end component of the voltage coefficient remains. Polysilicon resistors also have the significant disadvantage of being larger in physical size. Further, the output impedance of the analog reference must be minimized to insure a stable voltage even when the loads are switching at high frequencies. For improved operation at high frequencies, a pair of capacitors in parallel with each of the resistors can be added to lower the AC impedance at the tapping point of the voltage divider. Even with the addition of the capacitors, however, the a.c. impedances may still be relatively high for ground impedances. Finally, the addition of capacitors makes the voltage generation circuitry significantly larger, especially if current on the order of a milliamp or more is required. Depending on current requirements, the size of the capacitors, and the layout of the remainder of the integrated circuitry, there may be only enough space on-chip for a single, large mid-rail voltage generation circuit. Unless the output impedance of the voltage generator is substantially lower, a single voltage generator will result in cross-talk between the various circuits being supplied.

Thus, the need has arisen for circuitry and methods for generating voltages for use as analog ground references. Such circuitry and methods would provide for the generation of mid-rail voltage using a minimal amount of space while at the same time presenting a low output impedance even at high frequency.

SUMMARY OF THE INVENTION

According to the invention, a voltage generation circuit is provided which includes a first plurality of transistors having source/drain paths coupled in series to establish a first current path between a first voltage and a second voltage rail. The first transistors are provide a pre-selected intermediate voltage at a node along the first current path. A second plurality of transistors are provided having source/drain paths coupled in series to establish a second current path between the rails and coupled to the first transistors such that current flow in the second current path mirrors current flow in the first current path. The second plurality of transistors a provide voltage substantially equal to the intermediate voltage at a node along the second current path. A pair of output transistors are provided having source/drain paths coupled in series to establish a third current path between the voltage rails. A first one of the output transistors is coupled as a current mirror with a first one of the second plurality of transistors. A second one of the output transistors is coupled as a current mirror with a second one of the second plurality of transistors. First and second output transistors provide a voltage substantially equal to the intermediate voltage at an output node coupling the source/drain paths of the output transistors. The preferred embodiments of the present invention provide significant advantages over prior art voltage generation circuits.

The preferred embodiments of the present invention provide for the generation of a midrail voltage using a minimum amount of space on the integrated circuit, while at the same time presenting a low output impedance, even at high frequency.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an electrical schematic drawing of an embodiment of the present invention.

DETAILED DESCRIPTION OF THE INVENTION

The preferred embodiment of the present invention and its advantages are best understood by referring to FIG. 1 of the drawings, like numerals being used for like and corresponding parts of the various drawings.

Referring to FIG. 1, a mid-rail voltage generator according to the invention is shown generally at 10. Voltage generator 10 includes diode connected (i.e., having the gate shorted to drain) p-channel transistors 10 12, 14, 16 and 18, establishing a current path between a high voltage rail $V_{DD}$ and a low voltage rail $V_{SS}$. In the illustrated embodiment, the high voltage rail is at +5 volts, and the low voltage rail at ground. In alternate embodiments, the high and low voltage rails may differ, such as being set at +10 volts and 0 volts respectively.

As a general approximation:

$$I_{DS} = \frac{1}{2} \beta (V_{GS} - V_T)^2 \qquad (1)$$

and

-continued $$\beta = \mu C_o \frac{W}{L} \qquad (2)$$

where:
- $I_{DS}$ = current through the source-drain path;
- $V_{GS}$ = the gate to source voltage;
- $V_T$ = the threshold voltage for the device;
- $\mu$ = effective electron mobility of the channel for an n-channel device or in the alternative, the effective hole mobility of the channel for a p-channel device;
- $C_O$ = gate capacitance per unit area;
- $W$ = length of the channel; and
- $L$ = length of the channel.

For a given fabrication process $\mu C_O$ and $V_T$ are essentially constant such that the current $I_{DS}$ through a given field effect transistor for a given gate to source voltage $V_{GS}$ (or in the alternative the gate to source voltage $V_{GS}$ for a given current $I_{DS}$) becomes primarily function of the width and length of the transistor channel.

In the illustrated embodiment of voltage generator 10, transistors 12–18 are matched, each having a transistor channel width to length ratio of 20:1, resulting in the voltage at node A being substantially half of the supply voltage $V_{DD}$. The current flow through transistor 12 is then mirrored into transistor 20 establishing current flow between the voltage rails through transistors 20, 22, 24 and 26.

In the illustrated embodiment, transistors 20, 24 and 26 are matched to transistors 12–18 such that the current flow between the two parallel current paths is approximately equal. This configuration uses the least power; however, in alternate embodiments, transistor 20 can be scaled in size relative to transistor 12 to produce a current gain. Transistors 24 and 26 are then scaled in size relative to transistors 16 and 18 respectively, such that the voltage a node B substantially equals the voltage at node A (the mid-supply voltage).

Transistors 28 and 30 are the output devices for circuit 10. Transistor 28 mirrors the current flow in transistor 22, while transistor 30 mirrors the current flow in transistor 24. By matching the relative scaling in size between transistors 22 and 28 with the relative scaling in size between transistors 24 and 30, the output voltage $V_{AGND}$ is forced to the mid-supply (mid-rail) voltage. In the illustrated embodiment, transistors 28 and 30 have channel width to length ratios of eight times (i.e. n=8) the channel width to length ratios of transistors 22 and 24 resulting in a current gain of approximately eight. In alternative embodiments, the scaling in size between transistors 22 and 24 and transistors 28 and 30, respectively can be modified to vary the current gain. Advantageously, the output of circuitry 10 is provided by the common sources of transistors 28 and 30 which gives circuitry 10 a low output impedance (the output impedance $R_O$ approximating the inverse of the output transconductance or $1/g_m$).

For improved matching between the relative scaling in size between transistors 22 and 28 and the relative scaling in size between transistors 24 and 30, transistors 28 and 30 preferably comprise a series of parallel transistors, each parallel transistor substantially equivalent in size (i.e., having equivalent channel widths and lengths) to transistors 22 and 24 respectively. For example, in the illustrated embodiment where n=8, transistor 28 comprises eight parallel transistors each equivalent to transistor 22, and transistor 30 comprises eight parallel transistors each equivalent to transistor 24.

The only variation in setting the output voltage $V_{AGND}$ to half of the supply voltage $V_{DD}$ comes from the differences in conduction between transistors 28 and 30 (which includes differences in transconductance and output conductance due to channel length modulation). The transconductance between n-channel transistor 28 and p-channel transistor 30, which carry the same current, can be matched by equaling the betas (where $\beta = \mu C_O W/L$). To reduce problems with differing output conductance due to channel length modulation, longer channel lengths can be selected if speed and size are not critical.

Although the present invention and its advantages have been described in detail, it should be understood that various changes, substitutions and alterations can be made herein without departing from the spirit and scope of the invention as defined by the appended claims.

What is claimed is:

1. A voltage generation circuit comprising:
   a first plurality of transistors having source/drain paths coupled in series to establish a first current path between a first voltage rail and a second voltage rail, said first plurality of transistors providing a preselected intermediate voltage at a node along said first current path;
   a second plurality of transistors having source/drain paths coupled in series to establish a second current path between said rails and coupled to said first transistors such that current flow in said second current path mirrors current flow in said first current path, said second plurality of transistors providing a voltage substantially equal to said intermediate voltage at a node along said second current path; and
   a pair of output transistors having source/drain paths coupled in series to establish a third current path between said voltage rails, a first one of said output transistors coupled as a current mirror with a first one of said second plurality of transistors and a second one of said output transistors coupled as a current mirror with a second one of said second plurality of transistors, said first and second output transistors providing a voltage substantially equal to said intermediate voltage at an output node coupling said source/drain paths of said output transistors.

2. The voltage generation circuit of claim 1 wherein sources of said first and second ones of said output transistors are coupled at said output node.

3. The voltage generation circuit of claim 1 wherein said first plurality of transistors comprises a plurality of diode connected transistors configured as a voltage divider, said node along said first current path comprising a node coupling source/drain paths of a pair of said first transistors.

4. The voltage generation circuit of claim 1 wherein said second plurality of transistors comprises:
   a current mirror transistor having a source coupled to said first voltage rail, a gate coupled to a gate and drain of a first one of said first plurality of transistors, and a drain;
   a first diode connected transistor having a gate and a drain coupled to said drain of said current mirror transistor, and a source; and a second diode connected transistor having a source coupled to said source of said first diode connected transistor, a gate coupled to a drain, said drain of said second diode connected transistor coupled to said second voltage rail.

5. The voltage generation circuit of claim 4 wherein said first one of said output transistors includes a drain coupled to said first voltage rail, a gate coupled to said gate of said first diode connected transistor, and a source, and wherein said second one of said output transistors includes a source coupled to said source of said first output transistor, a gate coupled to said gate of said second diode connected transistor, and a drain coupled to said second voltage rail.

6. The voltage generation circuit of claim 1 wherein said first output transistor has a channel width to length ratio of n times a channel width to length ratio of said first one of said second plurality of transistors, and said second output transistor has a channel width to length ratio of n times a channel width to length ratio of said second one of said second plurality of transistors, wherein n is a positive integer.

7. The voltage generation circuit of claim 1 wherein said first voltage rail is at a positive voltage and said second voltage rail is at approximately zero volts.

8. Voltage generation circuitry comprising:
a first current path providing controlled current flow between a high voltage rail and a low voltage rail and comprising a plurality of transistors having source/drain paths coupled in series;
a second current path between said rails comprising:
a current mirroring transistor having a first source/drain coupled to said high voltage rail, a gate coupled to a gate and first source/drain of a first transistor of said first current path, and a second source/drain;
a second transistor having a gate and a first source/drain coupled to said second source/drain of said current mirroring transistor and a second source/drain, said second transistor having a channel of a selected width to length ratio; and
a third transistor having a first source/drain coupled to said second source/drain of said second transistor of said second current path, a second source/drain and a gate coupled to said second source/drain, said third transistor having a channel of a selected width to length ratio; output circuitry comprising:
a first output transistor having a first source/drain coupled to said high voltage rail, a gate coupled to said gate of said second transistor of said second current path, and a second source/drain, said first output transistor having a channel of a width to length ratio of n times said channel width to length ratio of said second transistor of said second current path; and
a second output transistor having a first source/drain coupled to said second source/drain of said first output transistor, a second source/drain coupled to said low voltage rail and a gate coupled to said gate of said third transistor of said second current path, said second output transistor having a channel width to length ratio of n times said channel width to length ratio of said third transistor of said second current path.

9. The voltage generation circuitry of claim 8 wherein said first output transistor comprises n transistors coupled in parallel, each parallel transistor having a channel width to length ratio substantially equal to said channel width to length ratio of said second transistor of said second current path.

10. The voltage generation circuitry of claim 8 wherein said second output transistor comprises n transistors coupled in parallel, each parallel transistor having a channel width to length ratio substantially equal to said channel width to length ratio of said third transistor of said second current path.

11. The voltage generation circuitry of claim 8 wherein a second source/drain of said first transistor of said first current path is connected to said high voltage rail.

12. The voltage generation circuitry of claim 11 wherein said first current path comprises said first transistor, a second transistor having a first source/drain coupled to said first source/drain of said first transistor, and a second source/drain, a third transistor having a first source/drain coupled to said second source/drain of said second transistor and a second source/drain, and a fourth transistor having a first source/drain coupled to said second source/drain of said third transistor and a second source/drain coupled to said low voltage rail, said first, second, third and fourth transistors matched to provide a preselected intermediate voltage at a node coupling said second source/drain of said second transistor and said first source/drain of said third transistor.

13. The voltage generation circuitry of claim 12 wherein said second current path further comprises a fourth transistor having a source/drain path coupling said second source/drain of said third transistor of said second current path to said low voltage rail, said current mirroring, third and fourth transistors of said second current path matched to establish a voltage substantially equal to said intermediate voltage at a node coupling said second source/drain of said second transistor with said first source/drain of said third transistor of said second current path.

14. The voltage generation circuitry of claim 8 wherein said second source/drain of said second transistor of said second current path comprises a source and said first source/drain of said third transistor of said second current path comprises a source.

15. The voltage generation circuitry of claim 8 wherein said second transistor of said second current path comprises an n-channel device, and said third transistor of said second current path comprises a p-channel device.

16. The voltage generation circuitry of claim 8 wherein said second source/drain of said first output transistor comprises a source and said first source/drain of said second output transistor comprises a source.

17. The voltage generation circuitry of claim 8 wherein said first output transistor comprises an n-channel device and said second output transistor comprises a p-channel device 18. A voltage generation circuit comprising:
a first plurality of transistors establishing a preselected current flow between a high voltage rail and a low voltage rail;
a second plurality of transistors having current paths coupled in series between said rails and mirroring current flow through said first plurality of transistors, said second plurality of transistors establishing a midsupply voltage at a node between first and second ones of said second plurality of transistors; and first and second output transistors having current paths coupled in series between said rails, said first output transistor mirroring current flow through said first one of said second plurality of transistors and said second output transistor mirroring current flow through said second one of said second plurality of transistors, said first and second output transistors selected to establish a voltage substantially equal to said midsupply voltage at a node coupling said current paths of said first and second output transistors.

19. A method of generating a midrail voltage comprising the steps of:

establishing a preselected current flow between first and second voltage rails through a first plurality of transistors;

mirroring the current flow through the first plurality of transistors with a second plurality of transistors having current paths coupled in series between the rails, the second plurality of transistors establishing a midsupply voltage at a node between first and second ones of the second plurality of transistors;

mirroring current flow through the first one of the second plurality of transistors with a first output transistor;

mirroring current flow through the second one of the second plurality of transistors with a second output transistor, the first and second output transistors having current paths coupled in series between the voltage rails and selected to establish a voltage substantially equal to said midsupply voltage at a node coupling said current paths of said first and second output transistors.

* * * * *